United States Patent
Edwards et al.

(10) Patent No.: US 9,059,111 B2
(45) Date of Patent: Jun. 16, 2015

(54) RELIABLE BACK-SIDE-METAL STRUCTURE

(71) Applicant: International Business Machines Corporation, Armonk, NY (US)

(72) Inventors: Robert D. Edwards, Marlboro, NY (US); Jeffrey P. Gambino, Westford, VT (US); Charles F. Musante, Burlington, VT (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 13/860,753

(22) Filed: Apr. 11, 2013

(65) Prior Publication Data

US 2014/0306322 A1    Oct. 16, 2014

(51) Int. Cl.
*H01L 23/00* (2006.01)
*H01L 21/768* (2006.01)

(52) U.S. Cl.
CPC ............. *H01L 24/32* (2013.01); *H01L 24/27* (2013.01); *H01L 21/76898* (2013.01)

(58) Field of Classification Search
CPC ........... H01L 2924/00014; H01L 2224/13147; H01L 2224/13111; H01L 21/76898; H01L 23/481; H01L 2924/01029; H01L 25/0657; H01L 2924/014; H01L 2924/01074; H01L 2225/06513; H01L 2225/06541; H01L 24/13; H01L 24/16
USPC ........... 257/774, E23.011, E21.577; 438/653, 438/667, 107, 613
See application file for complete search history.

(56) References Cited

U.S. PATENT DOCUMENTS

| | | | |
|---|---|---|---|
| 7,902,643 B2 | 3/2011 | Tuttle | |
| 7,919,834 B2 | 4/2011 | Davis et al. | |
| 7,968,460 B2 | 6/2011 | Kirby et al. | |
| 8,120,145 B2 | 2/2012 | Bavisi et al. | |
| 2010/0140805 A1* | 6/2010 | Chang et al. | 257/773 |
| 2010/0164109 A1 | 7/2010 | Chiou et al. | |
| 2011/0241185 A1 | 10/2011 | Koester et al. | |
| 2011/0309854 A1 | 12/2011 | Chou et al. | |
| 2011/0316168 A1* | 12/2011 | Moon et al. | 257/774 |
| 2012/0001337 A1* | 1/2012 | Tsai et al. | 257/770 |
| 2012/0018851 A1 | 1/2012 | Farooq et al. | |
| 2012/0256300 A1* | 10/2012 | Nakamura | 257/621 |

FOREIGN PATENT DOCUMENTS

WO        2012037140 A2    3/2012

* cited by examiner

*Primary Examiner* — David Vu
*Assistant Examiner* — Jonathan Han
(74) *Attorney, Agent, or Firm* — Anthony J. Canale; L. Jeffrey Kelly

(57) ABSTRACT

A semiconductor structure, method of manufacturing the same and design structure thereof are provided. The semiconductor structure includes a substrate including a semiconductor layer and a plurality of TSVs embedded therein. At least one TSV has a TSV tip extending from a backside surface of the substrate. The semiconductor structure further includes a multilayer metal contact structure positioned on the backside surface of the substrate. The multilayer metal contact structure includes at least a conductive layer covering the backside surface of the substrate and covering protruding surfaces of the TSV tip. The conductive layer has a non-planar first surface and a substantially planar second surface opposite of the first surface.

10 Claims, 4 Drawing Sheets

RELIABLE BACK-SIDE-METAL STRUCTURE

BACKGROUND

Field of the Invention

The present invention relates to electrically interconnecting via structures, such as, Through-Substrate-Via (TSV), and more particularly, to reliable electrical contact made to the exposed TSV structures at the bottom of a semiconductor wafer, method of manufacturing the same and design structure thereof.

In recent years, "three dimensional silicon" (3DSi) structures have been proposed to enable joining of multiple silicon chips and/or wafers that are mounted on a package or a system board. The 3DSi structures employ conductive via structures, TSVs, which provide electrical connection through the substrate of a semiconductor chip. The TSV structures increase the density of active circuits that are integrated in a given space. Such 3DSi structures employ TSVs to provide electrical connection among the multiple silicon chips and/or wafers.

A conventional "blind via" approach typically employs etching the vias in semiconductor material and metallization. When the "blind via" approach is used, the vias are not etched all the way through the wafer, so that a "through-via" is rendered only after the carrier is suitably thinned to expose the bottom portion of the via.

Typically, back side metallurgy (BSM) structures are employed to make electrical contact with the exposed, after thinning, TSV. One of the difficulties encountered in forming the BSM structures is forming a reliable contact structure. Such structures typically require multiple layers of metal to be formed at the wafer level. However, it has been found that diffusion of metal material into the semiconductor material can create detrimental effects such as electrical shorts within semiconductor devices in the substrate. Accordingly, it is desirable to provide a reliable BSM structure and method of forming the same.

SUMMARY

In an aspect of the invention, a semiconductor structure comprises a substrate including a semiconductor layer and a plurality of TSVs embedded therein. At least one TSV has a TSV tip extending from a backside surface of the substrate. The semiconductor structure further comprises a multilayer metal contact structure positioned on the backside surface of the substrate. The multilayer metal contact structure comprises at least a conductive layer covering the backside surface of the substrate and covering protruding surfaces of the TSV tip. The conductive layer has a non-planar first surface and a substantially planar second surface opposite of the first surface.

In yet another aspect of the invention, a method of fabricating a semiconductor structure comprises forming a plurality of TSVs within a semiconductor layer of a substrate. The method further comprises thinning a backside surface of the substrate. A tip of at least one TSV extends from the backside surface of the substrate. The method further comprises forming a conductive layer to cover the backside surface of the substrate and protruding surfaces of the TSV tip. The conductive layer has a non-planar first surface and a non-planar second surface opposite of the first surface. The method further comprises planarizing the second surface of the conductive layer.

A more complete understanding of the present invention, as well as further features and advantages of the present invention, will be obtained by reference to the following detailed description and drawings. It is to be understood that both the foregoing general description and the following detailed description are exemplary and explanatory only, and should not be considered restrictive of the scope of the invention, as described and claimed. Further, features or variations may be provided in addition to those set forth herein. For example, embodiments of the invention may be directed to various combinations and sub-combinations of the features described in the detailed description.

BRIEF DESCRIPTION OF THE SEVERAL VIEWS OF THE DRAWINGS

The present invention is described in the detailed description which follows in reference to the noted plurality of drawings by way of non-limiting examples of exemplary embodiments of the present invention.

DETAILED DESCRIPTION

An embodiment of the present invention relates to a structure and method of forming the BSM. More specifically, an embodiment of the present invention comprises a substrate including a semiconductor layer and a plurality of TSVs embedded therein. At least one TSV has a TSV tip extending from a backside surface of the substrate. The semiconductor structure further comprises a multilayer metal contact structure positioned on the backside surface of the substrate. The multilayer metal contact structure comprises at least a conductive layer covering the backside surface of the substrate and covering protruding surfaces of the TSV tip. The conductive layer has a non-planar first surface and a substantially planar second surface opposite of the first surface. The multilayer metal contact structure further comprises a diffusion barrier layer located on the second surface of the conductive layer. Advantageously, the diffusion barrier layer has substantially planar surfaces.

TSV technology is typically employed for vertically connecting electrical devices to the next level of packaging. Where the packaging of electronic devices involves silicon semiconductor chips or wafers, or silicon semiconductor chip carriers, the vertical interconnection may be made by at least one TSV. At least in some embodiments of the present invention, TSV structure may be used to connect active surface of the chip with one or more ground lines. The TSV structure has been found useful for improved density in packaging, such as applied to 3D integration. Semiconductor material other than silicon may, however, be similarly employed.

Although there are a variety of ways well known in the art to obtain a TSV, embodiments of the present inventions will be explained with respect to a "blind via" approach. The "blind via" technique allows drilling of vias of only a specified depth. Accordingly, a "through via" may be obtained only after the carrier is suitably thinned by grinding, for example, to expose a portion of the via.

Figure 1:
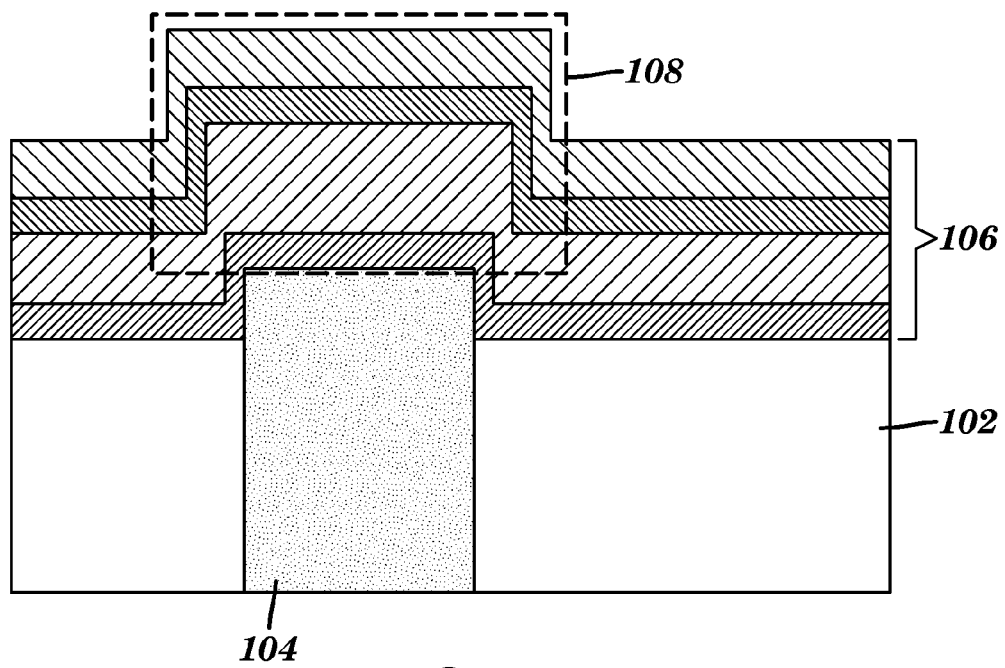
FIG. 1 is a cross-sectional view of a conventional BSM structure.

Referring now to the drawings, FIG. 1 shows a cross section of a semiconductor chip having a conventional TSV structure and a conventional BSM connection that includes an overlying electrically conductive structure 106. As shown in FIG. 1, after forming TSV 104 in semiconductor substrate 102, a multilayer metal electrical contact structure, referred to hereinafter as BSM structure 106, is formed on the backside of semiconductor substrate 102. Typically, BSM structure 106 uses several layers of metal. It is noted that, for convenience of description, the figures show semiconductor substrate 102 flipped over so that the substrate backside is on top.

Referring back to FIG. 1, each TSV 104 has a tip protruding through the backside of substrate 102. As a result of successive metal layer depositions, the conventional BSM structure 106 includes region 108, overlying TSV 104, that has a plurality of non-planar metal layers having at least one step-shaped portion, as shown in FIG. 1. Accordingly, these layers do not necessarily have a uniform thickness across the whole BSM structure 106. At least one of the layers may include copper (Cu). However, copper is very mobile and can diffuse quickly through certain materials. Electromigration of copper into semiconductor substrate 102 may ruin device performance. Similarly, oxidation of copper diffused into the top layer of BSM structure 106 may create unreliable connection. Region 108 of the conventional BSM structure 102 shown in FIG. 1 contains one or more weak points with respect to copper diffusion. Accordingly, copper diffusion and/or oxidation may lead to unreliable electrical connections between devices formed on the active surface of substrate 102 (not shown) and other chips or wafers interconnected with substrate 102 through TSV 104 and BSM structure 106.

In the following description, specific details, such as specific metals, layers of metal and dimensions are set forth by way of example. It will be apparent to one skilled in the art that the present invention may be practiced without these specific details. In other instances, well known processing, such as associated with chemical vapor deposition (CVD), is not described in detail in order not to unnecessarily obscure description of the embodiments of the present invention.

Figure 2:
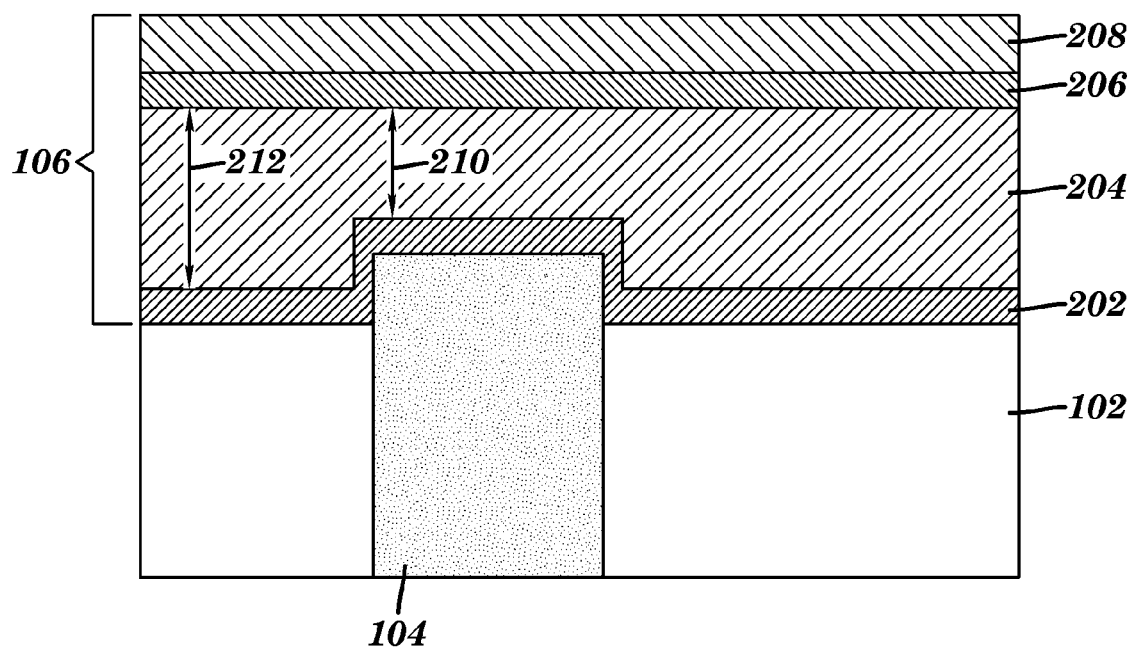
FIG. 2 is cross-sectional view of a BSM structure having a planarized surface of a conductive layer in accordance with an embodiment of the present invention.

FIG. 2 is cross-sectional view of a BSM structure having a planarized surface of a conductive layer in accordance with an embodiment of the present invention. FIG. 2 shows a chip arrangement with four layers of metal for BSM structure 106 attached to TSV 104. TSV 104 is shown in FIG. 2 as a solid metal conductor but may have a void in its interior portion. One arrangement for BSM structure 106 would be to employ adhesion layer 202. Adhesion layer 202 can be chromium (Cr), titanium (Ti), tantalum (Ta), nickel (Ni), molybdenum (Mo), iron (Fe), silicon (Si), titanium nitride (TiN), tantalum nitride (TaN), or the like.

BSM structure 106 shown in FIG. 2 may further include conductive layer 204. Specific examples of the metal that may be utilized to form conductive layer 204 include silver (Ag), copper (Cu), aluminum (Al), nickel (Ni), cobalt (Co), iron (Fe), palladium (Pd), and the like. In an embodiment of the present invention, conductive layer 204 may have a thickness in the range from approximately 0.1 microns to approximately 10 microns. The top layer of BSM structure 106 may include an oxidation resistant conductive inert layer 208 of a noble metal, such as gold. In an embodiment of the present invention, conductive inert layer 208 may have a thickness in the range from approximately 10 nm to approximately 1000 nm. The thicknesses used here are only by way of example. It should be noted that if copper is used for conductive layer 204, conductive inert layer 208 containing, for example, gold is not effective in protecting copper from oxidation because gold and copper readily interdiffuse. To solve this problem, BSM structure 106 may employ diffusion barrier layer 206 between conductive layer 204 and conductive inert layer 208. Diffusion barrier layer 206 is preferably contains one or more metal material selected from the group comprising titanium (Ti), tantalum (Ta), nickel (Ni), chromium (Cr), and the like. Auger analysis, for example, on the Cr/Cu/Ni/Au BSM structure 106 has demonstrated that copper diffusion into the gold layer, under accelerated stress conditions, is substantially limited by the nickel barrier layer 206. In an embodiment of the present invention, barrier layer 206 may, advantageously, have a substantially uniform thickness ranging from approximately 10 nm to approximately 1000 nm.

Unlike conventional BSM structure 106 shown in FIG. 1, in this exemplary embodiment, conductive layer 204 of BSM structure 106 has a planarized upper surface. Accordingly, diffusion barrier layer 206, overlying conductive layer 204, is substantially planar as well. As shown in FIG. 2, a portion of conductive layer 204 overlying TSV 104 has thickness 210 ranging from approximately 10 nm to approximately 1000 nm. However, portions of conductive layer 204 disposed adjacent to TSV 104 may have thickness 212 ranging from approximately 20 nm to approximately 5000 nm.

Figure 3:
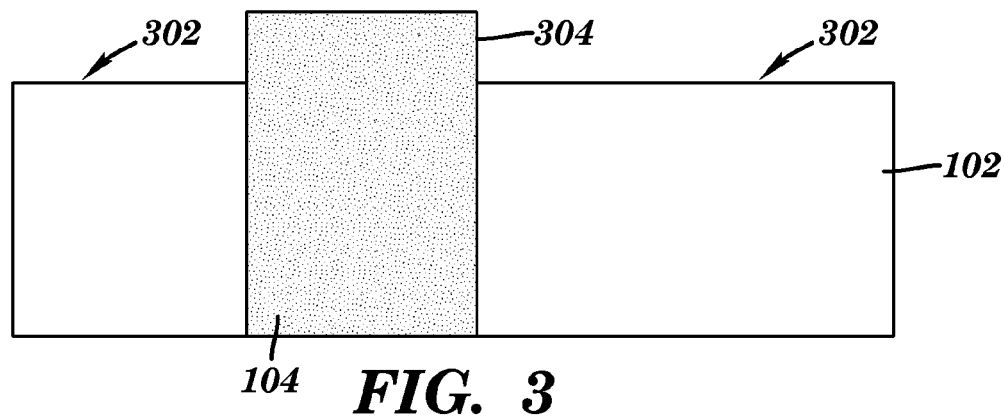
FIGS. 3 through 7 schematically illustrate method steps for fabrication of the BSM structure of FIG. 2 in accordance with an embodiment of the present invention.

FIGS. 3 through 7 schematically illustrate method steps for fabrication of the BSM structure having a planarized surface of a conductive layer in accordance with an embodiment of the present invention. As shown in FIG. 3, a deep reactive ion etch (RIE) method may be used to form one or more TSVs 104. However, etching is terminated (not shown in FIG. 3) prior to reaching the backside surface of semiconductor substrate 102. Typically the TSV 104 depth would be approximately 5 μm to approximately 250 μm. Although any of a variety of semiconductors may be used for substrate 102, typically silicon would be used. TSV 104 may be filled with a conductive material, such as tungsten or copper, to form a conductive via. Copper is preferred for TSVs 104 due to its high conductivity.

Following TSV 104 formation, substrate 102 is transferred, for example, to a commercial wafer grinding tool to expose TSVs 104 by mechanical thinning. Mechanical thinning may include, for example, the following three steps: coarse grinding, fine grinding, and final polish. Once TSVs 104 are polished, wet etching or dry etching may be employed to remove the last portion of semiconductor substrate 102, so as to leave TSV tips 304 protruding a distance of approximately 5 μm to approximately 15 μm from backside surface 302 of substrate 102. As a result of thinning, thickness of semiconductor substrate 102 may range, for example, from approximately 5 microns to approximately 200 microns.

Figure 4:
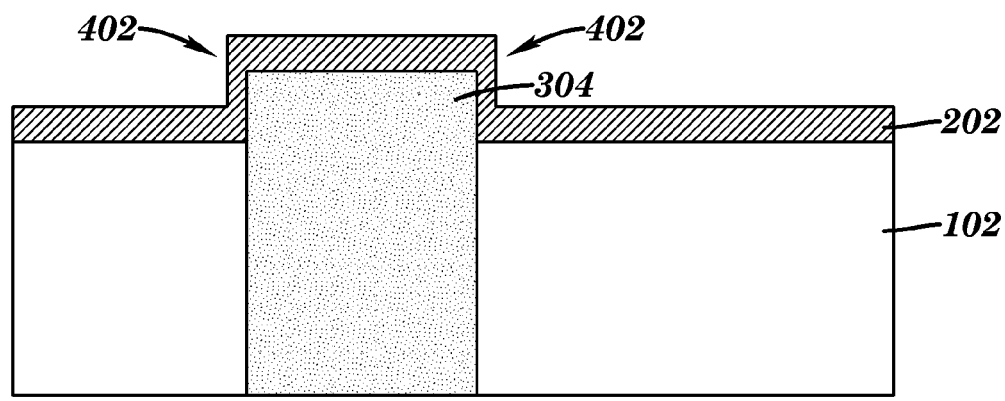

In an illustrative embodiment depicted in FIG. 4, adhesion layer 202 may be formed on backside surface 302 of substrate 102. It should be noted that backside surface 302 need not be subjected to an oxidation process or chemical mechanical polishing process, or the like, to condition surface 302 prior to the formation of adhesion layer 202. In this sense, adhesion layer 202 is an unconditioned surface although it may be subjected to a cleaning process to remove any contaminants prior to forming adhesion layer 202. By using adhesion layer 202, time-consuming and expensive processes associated with conditioning backside surface 302 with an oxidation and/or polishing process may be eliminated.

Adhesion layer 202 may be formed by a variety of known techniques. In one illustrative example, adhesion layer 202 may be formed by performing a physical vapor deposition (PVD) process. In this case, backside surface 302 may be subjected to a sputter etch process in the same chamber that is employed in forming adhesion layer 202 so as to remove contaminants from backside surface 302. Adhesion layer 202 may comprise chromium (Cr), titanium (Ti), tantalum (Ta), nickel (Ni), molybdenum (Mo), iron (Fe), silicon (Si), titanium nitride (TiN), tantalum nitride (TaN), or the like. In an embodiment of the present invention, adhesion layer 202 may have a thickness in the range from approximately 10 nm to approximately 1000 nm. In a particularly illustrative example, adhesion layer 202 may comprise an approximately 100 nm thick layer of chromium that is formed by a PVD process. As illustrated in FIG. 4, adhesion layer 202 has at least one step-shaped portion 402, since adhesion layer 202 is formed over backside surface 302 and protruding tip 304 of TSV 104. Therefore, at least in one embodiment, adhesion layer 202 is non-planar.

Figure 5:
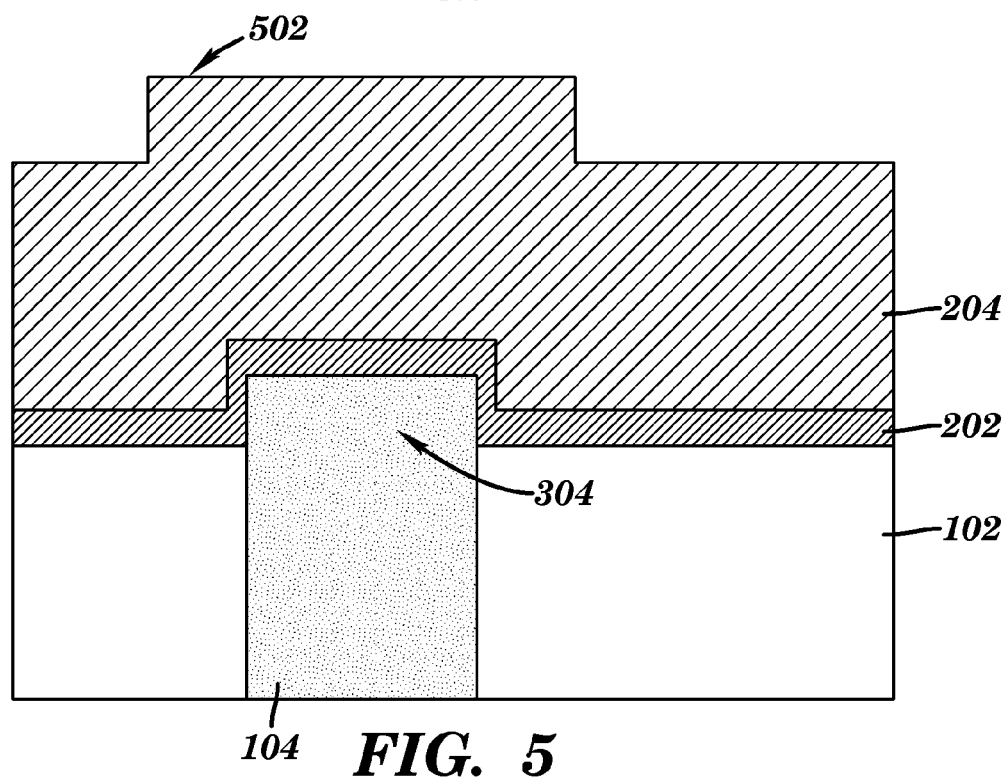

Next, conductive layer 204 may be formed on adhesion layer 202 by PVD, for example, as shown in FIG. 5. Conductive layer 204 may include silver (Ag), copper (Cu), aluminum (Al), nickel (Ni), cobalt (Co), iron (Fe), palladium (Pd), and the like. Copper is preferred for conductive layer 204 due to its high conductivity. As shown in FIG. 5 portion 502 of conductive layer 204 overlying TSV tip may protrude a distance of approximately 20 nm to approximately 4 μm from the adjacent portions of the deposited conductive layer 204. It should be noted that conventional successive process steps would create uneven topography for the successive layers as well.

Figure 6:
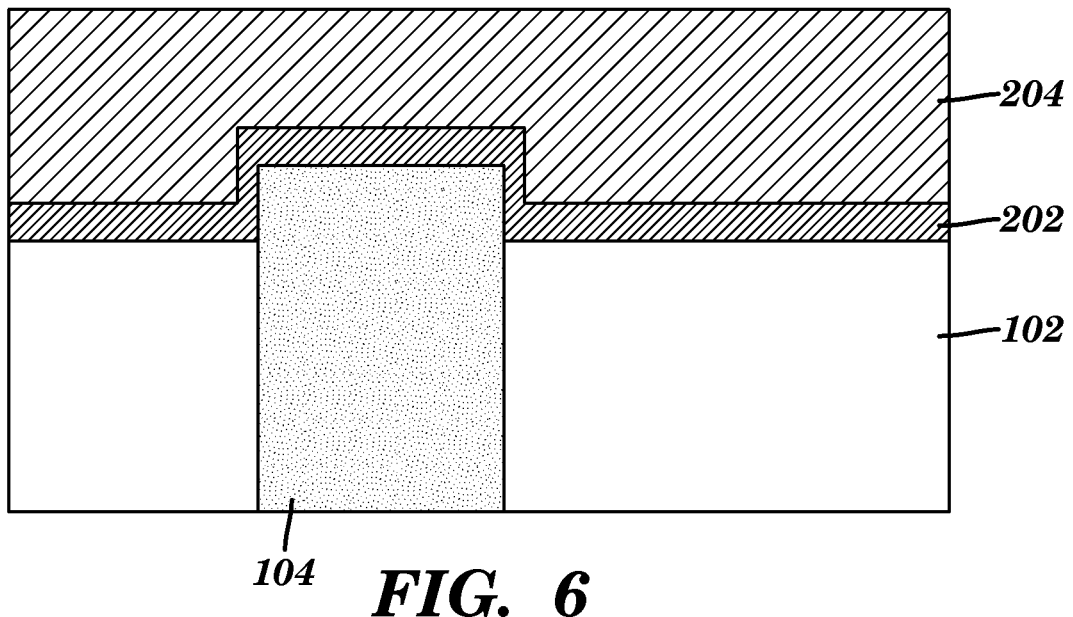

However, advantageously, planarization of conductive layer 204 may be performed before further processing. In an embodiment of the present invention, planarization and selective removal of conductive layer 204 may be accomplished in a polishing step. Referring to FIG. 6, conductive layer 204 may be blanket-planarized using, for example, a chemical mechanical polishing (CMP) process or an etchback process. The thickness of conductive layer 204 may be reduced, for example, during the removal process. After removing protruding portion 502, the surface of conductive layer 204 may be substantially planar. After planarization, conductive layer 204 may have a thickness in the range from approximately 10 nm to approximately 4 μm.

Figure 7:
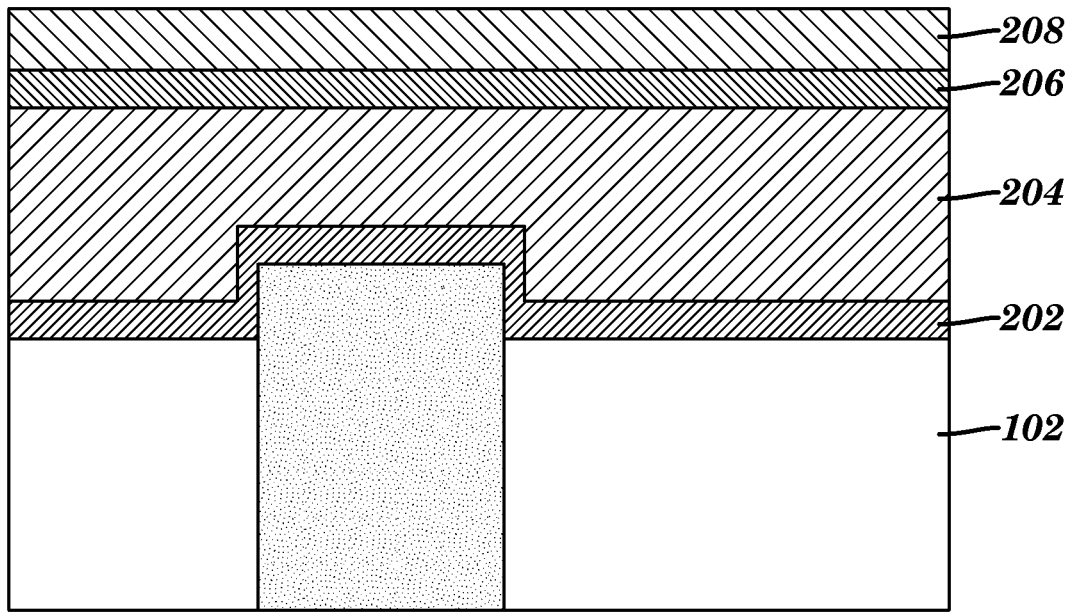

FIG. 7 illustrates the formation of diffusion barrier layer 206, which protects conductive layer 204 from oxidation. Diffusion barrier layer 206 can be applied by any one of a variety of techniques. In an illustrative embodiment, diffusion barrier layer 206 may be formed by depositing the barrier material on planarized conductive layer 204 using PVD method, for example. Specific examples of the metal that may be utilized to form diffusion barrier layer 206 include, but are not limited to titanium (Ti), tantalum (Ta), nickel (Ni), chromium (Cr), and the like. Auger analysis, for example, on the Cr/Cu/Ni/Au BSM structure 106 has demonstrated that copper diffusion into the gold layer, under accelerated stress conditions, is substantially limited by the nickel diffusion barrier layer 206. In an embodiment of the present invention, diffusion barrier layer 206 may have, advantageously, a substantially uniform thickness ranging from approximately 10 nm to approximately 1000 nm.

FIG. 7 further illustrates the formation of an oxidation resistant conductive inert layer 208 of a noble metal. To form conductive inert layer 208 on substantially planar diffusion barrier layer 206, a PVD method such as sputtering method, a vacuum deposition method, an ion plating method, and the like, may be used. Furthermore, to form conductive inert layer 208, at least one noble metal may be selected from gold (Au), platinum (Pt), palladium (Pd), and the like. It is known that, Au, Pt, and Pd are excellent in oxidation resistance and are excellent in electrical conductivity because they are transition metals. Therefore, by forming conductive inert layer 208 using a noble metal appropriately selected from these, it becomes possible to impart excellent oxidation resistance and electrical conductivity to BSM structure 106. The thickness of conductive inert layer 208 may range from approximately 10 nm to approximately 1000 nm.

Thus, as shown in FIG. 7, the resultant BSM structure 106 includes planarized diffusion barrier layer 206 disposed on the planarized surface of conductive layer 204. Advantageously, this structure improves reliability of electrical connections by eliminating weak step-shaped portions within BSM structure 106.

Figure 8:
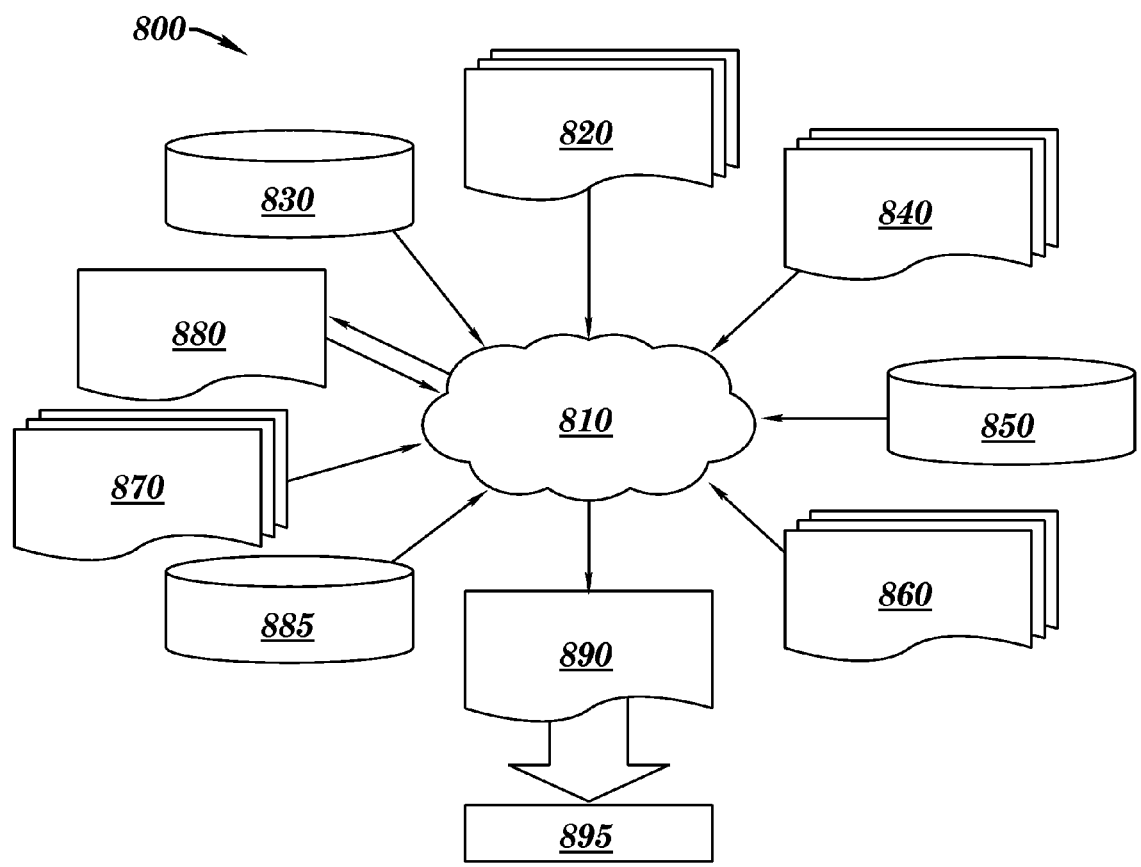
FIG. 8 is a flow diagram of a design process used in semiconductor design, manufacture, and/or test.

FIG. 8 shows a block diagram of an exemplary design flow 800 used for example, in semiconductor IC logic design, simulation, test, layout, and manufacture. Design flow 800 includes processes, machines and/or mechanisms for processing design structures or devices to generate logically or otherwise functionally equivalent representations of the design structures and/or devices described above and shown in FIGS. 2-7. The design structures processed and/or generated by design flow 800 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 800 may vary depending on the type of representation being designed. For example, a design flow 800 for building an application specific IC (ASIC) may differ from a design flow 800 for designing a standard component or from a design flow 800 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 820 that is preferably processed by a design process 810. Design structure 820 may be a logical simulation design structure generated and processed by design process 810 to produce a logically equivalent functional representation of a hardware device. Design structure 820 may also or alternatively comprise data and/or program instructions that when processed by design process 810, generate a functional representation of the physical structure of a hardware device. Whether representing functional and/or structural design features, design structure 820 may be generated using electronic computer-aided design (ECAD) such as implemented by a core developer/designer. When encoded on a machine-readable data transmission, gate array, or storage medium, design structure 820 may be accessed and processed by one or more hardware and/or software modules within design process 810 to simulate or otherwise functionally represent an electronic component, circuit, electronic or logic module, apparatus, device, or system such as those shown in FIGS. 2-7. As such, design structure 820 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 810 preferably employs and incorporates hardware and/or software modules for synthesizing, translating, or otherwise processing a design/simulation functional equivalent of the components, circuits, devices, or logic structures shown in FIGS. 2-7 to generate a netlist 880 which may contain design structures such as design structure 820. Netlist 880 may comprise, for example, compiled or otherwise processed data structures representing a list of wires, discrete components, logic gates, control circuits, I/O devices, models, etc. that describes the connections to other elements and circuits in an integrated circuit design. Netlist 880 may be synthesized using an iterative process in which netlist 880 is resynthesized one or more times depending on design specifications and parameters for the device. As with other design structure types described herein, netlist 880 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 810 may include hardware and software modules for processing a variety of input data structure types including netlist 880. Such data structure types may reside, for example, within library elements 830 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 840, characterization data 850, verification data 860, design rules 870, and test data files 885 which may include input test patterns, output test results, and other testing information. Design process 810 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 810 without deviating from the scope and spirit of the invention. Design process 810 may also include modules for performing standard circuit design processes such as timing analysis, verification, design rule checking, place and route operations, etc.

Design process 810 employs and incorporates logic and physical design tools such as HDL compilers and simulation model build tools to process design structure 820 together with some or all of the depicted supporting data structures along with any additional mechanical design or data (if applicable), to generate a second design structure 890. Design structure 890 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 820, design structure 890 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-7. In an embodiment, design structure 890 may comprise a compiled, executable HDL simulation model that functionally simulates the devices shown in FIGS. 2-7.

Design structure 890 may also employ a data format used for the exchange of layout data of integrated circuits and/or symbolic data format (e.g., information stored in a GDSII (GDS2), GL1, OASIS, map files, or any other suitable format for storing such design data structures). Design structure 890 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-7. Design structure 890 may then proceed to a stage 895 where, for example, design structure 890 proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a substrate including a semiconductor layer and a plurality of through substrate vias (TSVs) embedded therein, at least one TSV having a TSV tip extending from a backside surface of the substrate; and
   a multilayer metal contact structure positioned on the backside surface of the substrate, the multilayer metal contact structure including a conductive layer and a diffusion barrier layer, wherein the conductive layer has a non-planar first surface covering the back side surface of the substrate and protruding surfaces of the TSV tip, the conductive layer has a substantially planar second surface, the diffusion barrier layer covers the entirety of the second surface, and the diffusion barrier layer is a conductive material.

2. The semiconductor structure of claim 1, wherein diffusion barrier layer having substantially planar first and second surfaces.

3. The semiconductor structure of claim 1, wherein the multilayer metal contact structure further comprises an adhesion layer covering the backside surface of the substrate and wherein the conductive layer overlies the adhesion layer.

4. The semiconductor structure of claim 2, wherein the multilayer metal contact structure further comprises another conductive layer overlying the second surface of the substantially planar diffusion barrier layer.

5. The semiconductor structure of claim 1, wherein a portion of the conductive layer overlying the TSV tip has a thickness ranging from approximately 10 nm to approximately 1000 nm.

6. The semiconductor structure of claim 1, wherein a portion of the conductive layer laterally adjacent to the TSV tip has a thickness ranging from approximately 20 nm to approximately 5000 nm.

7. The semiconductor structure of claim 1, wherein the conductive layer comprises at least one of silver (Ag), copper (Cu), aluminum (Al), nickel (Ni), cobalt (Co), iron (Fe), and palladium (Pd).

8. The semiconductor structure of claim 2, wherein the diffusion barrier layer comprises at least one of titanium (Ti), tantalum (Ta), nickel (Ni), and chromium (Cr).

9. The semiconductor structure of claim 3, wherein the adhesion layer comprises at least one of chromium (Cr), titanium (Ti), tantalum (Ta), nickel (Ni), molybdenum (Mo), iron (Fe), silicon (Si) titanium nitride (TiN), and tantalum nitride (TaN).

10. The semiconductor structure of claim 2, wherein the diffusion barrier layer has a substantially uniform thickness ranging from approximately 10 nm to approximately 1000 nm.

* * * * *